(12) United States Patent
Vasilev et al.

(10) Patent No.: US 10,298,163 B2
(45) Date of Patent: May 21, 2019

(54) APPARATUS AND METHOD FOR CONTROLLING A HAPTIC ACTUATOR

(71) Applicant: Dialog Semiconductor (UK) Limited, London (GB)

(72) Inventors: Vladislav Vasilev, Edinburgh (GB); David Eke, Dalkeith (GB); David Tyndall, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/641,360

(22) Filed: Jul. 5, 2017

(65) Prior Publication Data
US 2018/0158289 A1   Jun. 7, 2018

(30) Foreign Application Priority Data
Dec. 6, 2016   (GB) .................. 1620746.6

(51) Int. Cl.
| | |
|---|---|
| H04B 3/36 | (2006.01) |
| H02P 25/032 | (2016.01) |
| H03L 5/00 | (2006.01) |
| H03L 7/099 | (2006.01) |
| G08B 6/00 | (2006.01) |
| H02P 7/03 | (2016.01) |
| H02P 6/182 | (2016.01) |
| H02P 6/28 | (2016.01) |

(52) U.S. Cl.
CPC .............. *H02P 25/032* (2016.02); *G08B 6/00* (2013.01); *H02P 7/04* (2016.02); *H03L 5/00* (2013.01); *H03L 7/099* (2013.01); *H02P 6/182* (2013.01); *H02P 6/28* (2016.02)

(58) Field of Classification Search
CPC ....... G08B 6/00; A61M 2205/582; H04B 3/36
See application file for complete search history.

(56) References Cited

U.S. PATENT DOCUMENTS

| | | | |
|---|---|---|---|
| 7,982,711 B2* | 7/2011 | Anastas .................. | G06F 3/016 318/568.17 |
| 2017/0133966 A1* | 5/2017 | Khan ............... | G01R 19/16547 |
| 2017/0330167 A1* | 11/2017 | Yoon ..................... | G06Q 20/32 |

OTHER PUBLICATIONS

"DRV2605L 2 to 5.2 V Haptic Driver for LRA and ERM With Effect Library and Smart-Loop Architecture," Data Sheet, SLOS854C, May 2014, Copyright © 2017, Texas Instruments Incorporated, 69 pgs.

* cited by examiner

*Primary Examiner* — Phung Nguyen
(74) *Attorney, Agent, or Firm* — Saile Ackerman LLC; Stephen B. Ackerman (57) ABSTRACT

A haptic system with a haptic actuator and a voltage sensor coupled to the haptic actuator, to sense a voltage across the haptic actuator. The voltage across the haptic actuator has a back electromotive force component. There is a current regulator coupled to the haptic actuator and to the voltage sensor. The current regulator is adapted to provide a current signal to drive the haptic actuator and to adjust the current signal based on the back electromotive force component. For example, the voltage across the haptic actuator may be a direct voltage or a representation of the voltage such as a filtered value of the voltage.

19 Claims, 10 Drawing Sheets

APPARATUS AND METHOD FOR CONTROLLING A HAPTIC ACTUATOR

TECHNICAL FIELD

The present disclosure relates to an apparatus and methods for controlling a haptic actuator. In particular, the present invention relates to an apparatus and method for controlling a linear resonant actuator or an eccentric rotating mass.

BACKGROUND

Haptic actuators are commonly used with electronic devices to provide the user with a sensory signal also referred to as haptic feedback. For example, mobile phones are often equipped with a haptic actuator which vibrates to provide a notification for a user, for example as an alert that a text message has been received.

To this end different types of haptic actuators have been developed, among which are the eccentric rotating mass, ERM, and the linear resonant actuator, LRA.

ERMs are based on a single-phase DC motor driving an eccentric mass. The system being asymmetric, spinning the mass creates a force proportional to the velocity of the mass squared divided by the radius of rotation, that is then perceived by the user. Upon rotation of the mass, a back electromotive force, BEMF, is generated across the motor that opposes the voltage of the source that created it. The BEMF is proportional to the frequency of rotation of the mass and can be used to provide a feedback to a controller operating the motor.

ERMs have a relatively slow startup time and a low efficiency in converting electrical to mechanical energy. In addition, the vibrational strength of ERMs depends on the frequency of oscillation. These properties limit the use of ERMS for haptic applications.

LRAs are based on an inductive coil coupled to a spring holding a permanent magnet. In operation, the spring and mass system move along a single axis. When a current is passing in one direction through the coil it creates a magnetic field that repels the magnet. When passing the current in the other direction the magnetic field attracts the magnet. The system has a mechanical resonance frequency typically in the range of 50-300 Hz. The resonant frequency provides the optimal push/pull combination in time to drive the magnet at its maximum acceleration. In addition, the system has a relatively high Q factor, which means that when driven off resonance it produces little motion. The BEMF of the LRA is proportional to the amplitude of its oscillations.

Compared with ERMs, LRAs are approximately twice more efficient in converting electrical to mechanical energy. Additionally, LRAs provide a well-controlled haptic feedback to the user, as only the amplitude of vibration of the system varies and not its frequency.

The resonant frequency of LRAs varies due to manufacturing process. As a result, the resonant frequency may differ from the specified value, with an error of about 10%. Additionally, the resonant frequency depends on the mass to which the motor is attached, temperature, lifetime degradation, and the amplitude of the motor vibration (resonant point changes based on AC signal amplitude). All these variations mean that driving the LRA with a fixed frequency is not sufficient to achieve the maximum system performance. Additionally, even if the resonant frequency of a specific motor is known before applying signal to it, the signal itself could change the resonance point. These factors mean that driving an LRA motor at its most efficient and highest-vibrational strength point requires a closed loop system that actively tracks the resonant frequency.

Different systems have been designed to control ERMs and LRAs. In these systems, the haptic actuator is being driven by a voltage signal and the BEMF is sensed and used as a feedback signal. In a first approach, the BEMF can be sensed only once the driving of the haptic actuator has been interrupted. In a second approach, sensing channels, are used to sense on the fly the current and voltage across the LRA. This allows monitoring the frequency of operation of the haptic actuator at any time but requires a complex analog design and significant digital processing, which increases both the footprint and the power consumption of the system.

SUMMARY

It is an object of the invention to address one or more of the above-mentioned limitations. According to a first aspect of the disclosure, there is provided a haptic system comprising a haptic actuator; a voltage sensor coupled to the haptic actuator, to sense a voltage across the haptic actuator, wherein the voltage across the haptic actuator comprises a back electromotive force component; and a current regulator coupled to the haptic actuator and to the voltage sensor; the current regulator being adapted to provide a current signal to drive the haptic actuator and to adjust the current signal based on the back electromotive force component.

For example, the voltage across the haptic actuator may be a direct voltage or a representation of the voltage such as a filtered value of the voltage.

Optionally, the haptic system comprises a controller coupled to the current regulator and to the voltage sensor; the controller being adapted to receive the voltage across the haptic actuator, and to provide a control signal to the current regulator.

Optionally, the control signal may be adapted to adjust at least one of an amplitude and a phase of the current signal.

For example, the controller may be adapted to generate a first control signal to adjust an amplitude of the current signal and a second control signal to adjust a phase of the current signal.

Optionally, the controller may be adapted to extract the back electromotive force component from the voltage and to generate the control signal based at least in part on the back electromotive force component.

Optionally, the current signal may comprise a portion which remains substantially constant during a time-window; and the voltage sensor may be adapted to sense the voltage across the haptic actuator at a point in time within the time-window.

Optionally, the controller may be adapted to monitor a parameter of the back electromotive force component; and to generate the control signal based on the parameter.

Optionally, the controller may be adapted to compare the parameter with a reference value.

Optionally, the parameter comprises at least one of an amplitude, a phase, and a frequency of the back electromotive force component.

Optionally, the current regulator comprises a current driver coupled to a current control loop.

Optionally, the current control loop comprises a current sensor to sense the current signal, and a comparator to compare the current signal with the control signal and to generate an error signal.

For example, the control signal may be a direct signal or a representation of the signal such as a filtered value of the signal.

According to a second aspect of the disclosure, there is provided an apparatus for controlling a haptic actuator, the apparatus comprising a voltage sensor to sense a voltage across the haptic actuator; wherein the voltage across the haptic actuator comprises a back electromotive force component; and a current regulator; the current regulator being adapted to provide a current signal to drive the haptic actuator and to adjust the current signal based on the back electromotive force component.

According to a third aspect of the disclosure, there is provided a mobile device comprising a haptic system; the haptic system comprising a haptic actuator; a voltage sensor coupled to the haptic actuator, to sense a voltage across the haptic actuator; wherein the voltage across the haptic actuator comprises a back electromotive force component; and a current regulator coupled to the haptic actuator and to the voltage sensor; the current regulator being adapted to provide a current signal to drive the haptic actuator and to adjust the current signal based on the back electromotive force component.

The options described with respect to the first aspect of the disclosure are also common to the second and third aspects of the disclosure.

According to a fourth aspect of the disclosure, there is provided a method of operating a haptic actuator comprising providing a current signal to drive the haptic actuator; sensing a voltage across the haptic actuator while driving the haptic actuator; wherein the voltage across the haptic actuator comprises a back electromotive force component; and adjusting the current signal based on the back electromotive force component.

Optionally, the method comprises extracting the back electromotive force component from the sensed voltage.

Optionally, the method comprises identifying a time-window during which the current signal remains substantially constant; and sensing the voltage across the haptic actuator at a point in time within the time-window.

Optionally, regulating the current signal comprises generating a control signal based on the back electromotive force component.

Optionally, the method comprises monitoring a parameter of the back electromotive force component; and generating the control signal based on the parameter.

Optionally, generating the control signal comprises comparing the parameter with a reference value.

Optionally, the parameter comprises at least one of an amplitude, a phase, and a frequency of the back electromotive force component.

Optionally, the method comprises sensing the current signal, comparing the current signal with the control signal and generating an error signal.

BRIEF DESCRIPTION OF THE DRAWINGS

The invention is described in further detail below by way of example and with reference to the accompanying drawings, in which.

DESCRIPTION

Figure 1:
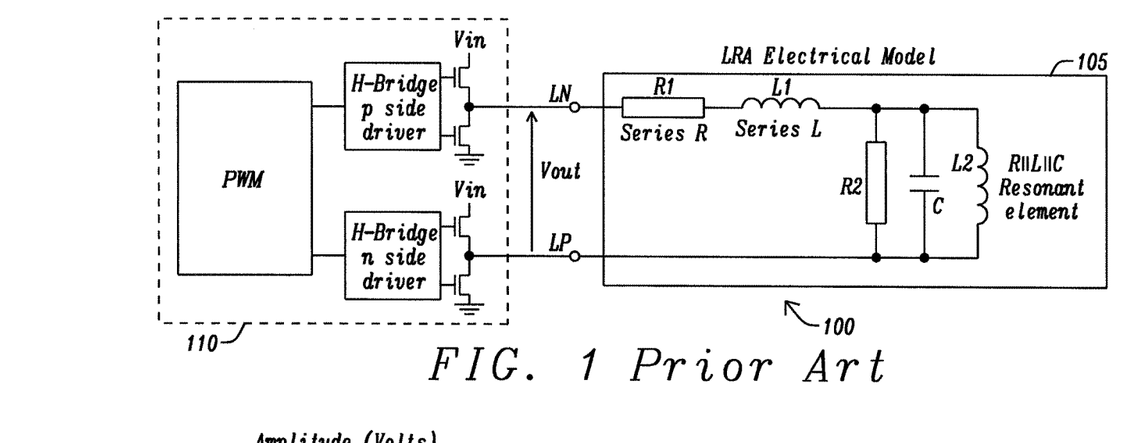
FIG. 1 is a haptic system according to the prior art.

FIG. 1 illustrates a haptic system 100 according to the prior art. The system includes an LRA 105 connected to circuit 110 to regulate a voltage signal applied to the LRA. The circuit 110 includes a differential H-bridge driver and a pulse width modulation controller. The LRA 105 is modelled as a first resistor R1 in series with a first inductor L1 combined with a second resistor R2 in parallel with a second inductor L2 and a capacitor C2. The motion of the magnetic mass of the LRA is represented by R2, L2 and C, while the internal coils of the LRA are represented by R1 and L1.

In operation, the LRA 105 is driven by an AC voltage signal provided by the differential H-bridge driver 110. The H-bridge driver uses a pulse width modulation, PWM signal at 20 kHz to provide a low-frequency (30-300 Hz) voltage signal across the LRA 105.

When the PWM signal is present, the output voltage can be derived as $$V_{out} = IR + L\frac{di}{dt} + V_{BEMF} \quad (1)$$

where I is the current drive, R is the resistance of the LRA, L is the inductance of the LRA and $V_{BEMF}$ is the back-EMF voltage.

Figure 2:
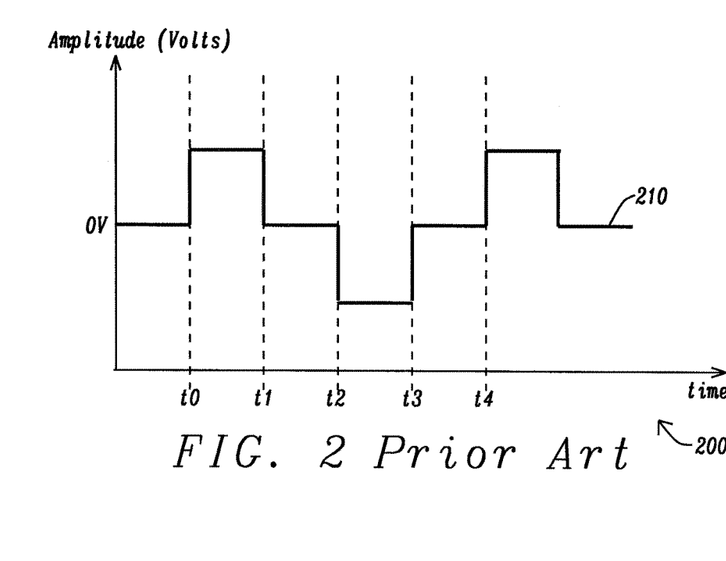
FIG. 2 is a time chart illustrating the working of the converter of FIG. 1.

FIG. 2 shows the AC drive voltage signal 210 provided by the differential H-bridge driver 110.

Between times t0 and t1, the differential H-bridge is operated to provide a positive drive voltage 210. At time t1, the differential H-bridge stops driving the LRA.

Between times t1 and t2, the four switches of the differential H-bridge are open, and the drive voltage 210 is zero. The components IR and Ldi/dt are null.

The LRA has mechanical inertia, so even if it is not driven for a short period of time it will continue moving and generating $V_{BEMF}$. When the component Ldi/dt reaches zero, $V_{out}=V_{BEMF}$. At this point in time the BEMF is sensed and its amplitude and phase used in a control loop to adjust the drive frequency of the drive voltage signal 210, to match the resonant frequency of the LRA.

A time t2, the differential H-bridge is operated to provide a negative drive voltage 210. The differential H-bridge continues driving voltage across the LRA until the next zero cross at time t3.

Measuring the BEMF allows monitoring the LRA motor vibrational amplitude, which in turn enables not only resonance tracking but also active acceleration and braking. To accelerate the LRA, the differential H-bridge overdrives the LRA above its target voltage value to get the BEMF (and amplitude of vibration) to the expected level. At this point the drive strength is reduced to the intended nominal value. To brake, the reverse procedure is applied. The drive signal is flipped 180 degrees relative to the BEMF, which causes the motor to slow down and to stop. At this point the driver stops applying any signal.

Figure 3:
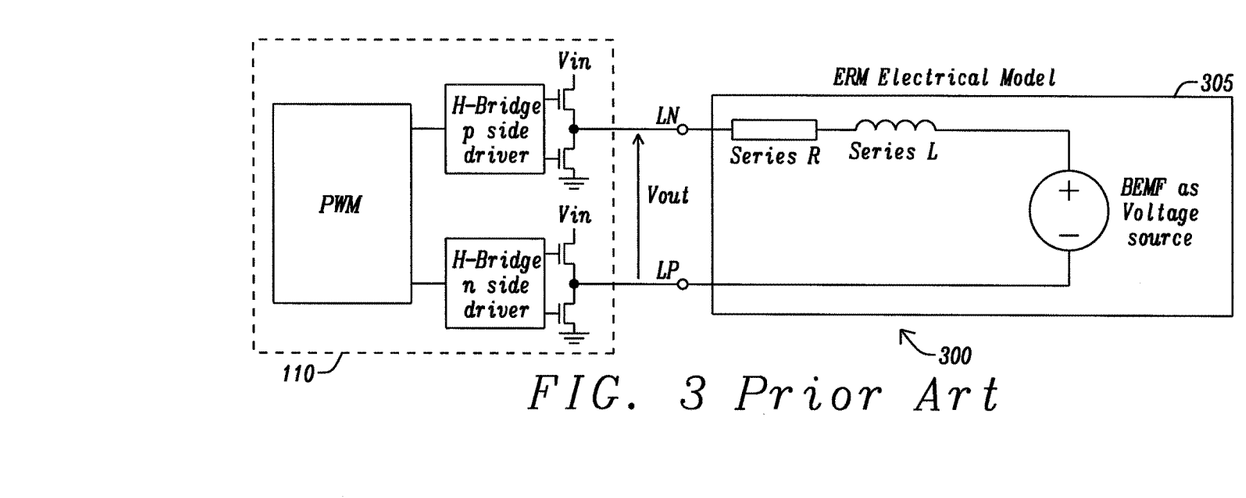
FIG. 3 is another haptic system according to the prior art.

FIG. 3 shows another vibration system 300. In this instance the haptic actuator is an ERM. The ERM can be modelled as a resistor in series with an inductor, and a voltage source representing the BEMF.

In operation, the differential H-bridge is used to drive the ERM with a DC voltage. The higher the voltage, the higher the frequency of rotation of the mass, and the greater is the acceleration. Braking is performed by reversing the voltage applied across the ERM.

The BEMF is proportional to the speed of rotation of the motor. In other words, the frequency of rotation is directly proportional to the back electromotive force generated across the motor.

The output voltage can be expressed as:

$$V_{out} = IR + L\frac{di}{dt} + V_{BEMF} \quad (2)$$

where I is the current drive, R is the resistance of the ERM, L is the inductance of the ERM and $V_{BEMF}$ is the back-EMF voltage.

The DC BEMF is sensed when the differential the H-bridge is in a high impedance state, i.e the four switches of the H-bridge are open. The circuit 110 is used to regulate the voltage signal applied to the ERM.

The approach described with reference to FIGS. 1 to 3 requires stopping driving the haptic actuator in order to perform measurement of the BEMF. As a result, such an approach prevents driving the haptic actuator continuously.

Figure 4:
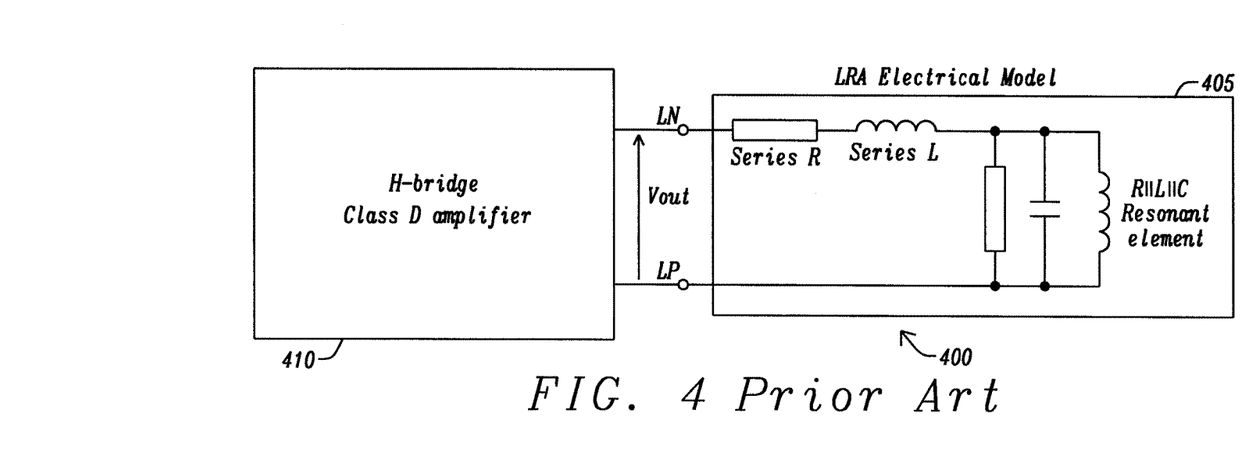
FIG. 4 is yet another haptic system according to the prior art.

FIG. 4 shows another vibration system 400 according to the prior art. In this example, an LRA 405 is connected to a circuit 410 comprising a H-bridge class D amplifier.

In operation, the class D amplifier provides a voltage across the LRA 405. Voltage and current sensing channels, not shown, are used to sense on the fly the current and voltage across the LRA. This allows monitoring whether the system is operated at resonance frequency. The circuit 410 is then used to regulate the voltage applied to the LRA.

Such an approach allows extraction of the LRA impedance but requires a relatively large circuit. The circuit of FIG. 4 is approximately 2 to 3 times larger than the circuit of FIG. 1. Such an approach also requires high precision ADCs and Class-D amplifier, which increase power consumption significantly.

The system of FIG. 4 can also be operated by providing at start up a step input to the LRA and by measuring the resonance frequency of the LRA. Such an approach provides a good initial guess of the LRA resonance but does not allow continuous tracking of the resonance. In addition, this approach does not permit active acceleration or braking.

Figure 5:
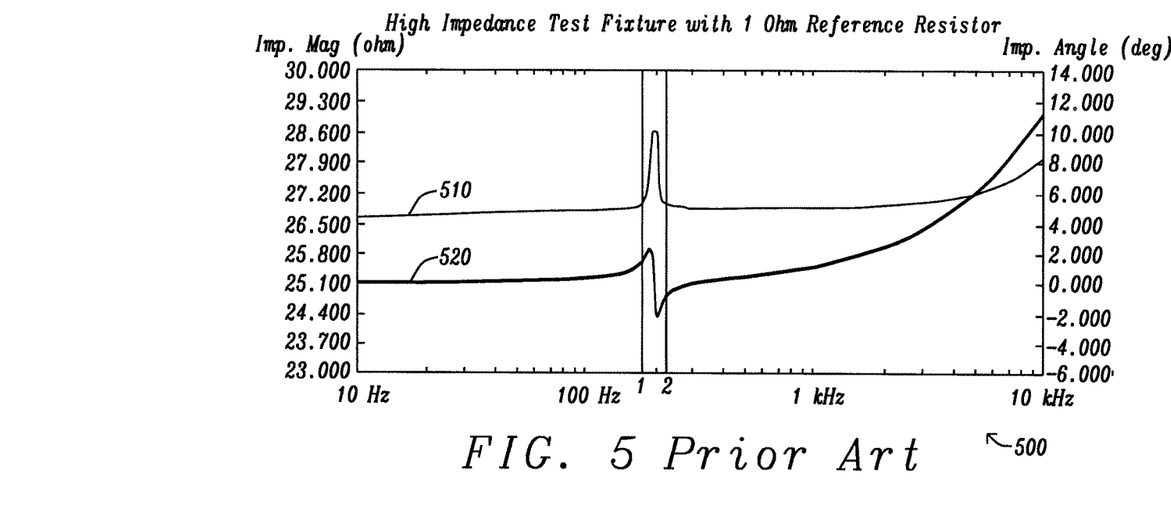
FIG. 5 is a time chart illustrating the working of the system of FIG. 4.

FIG. 5 shows the real and imaginary parts of the impedance of a sample LRA as a function of frequency. At the resonance frequency of 175 Hz, the real part of the impedance reaches a maximum value. When driving a constant voltage across the LRA, the current across the LRA decreases at resonance.

Figure 6:
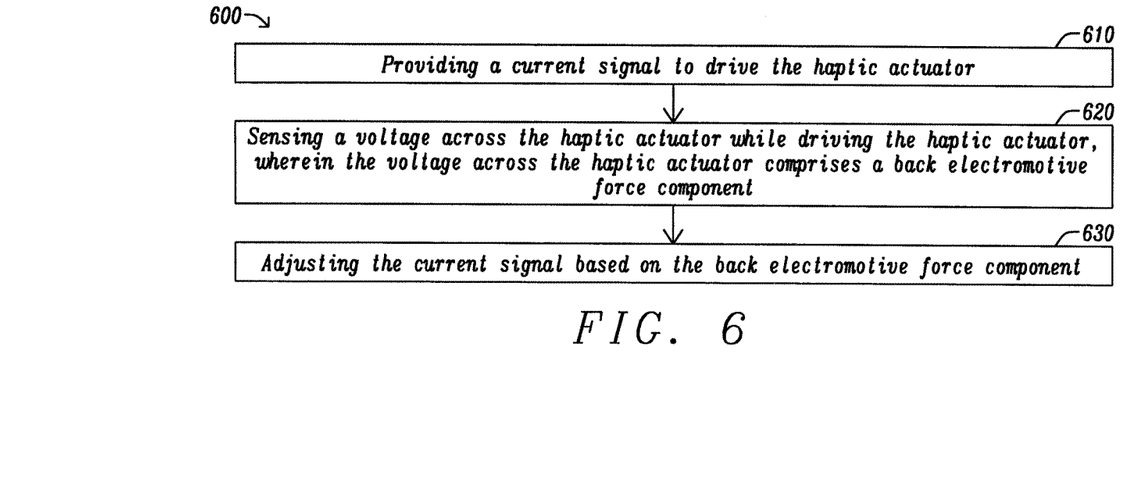
FIG. 6 is a flow chart of a method of operating a haptic actuator.

FIG. 6 illustrates a method of driving a haptic actuator according to the present disclosure.

At step 610, a current signal is provided to drive the haptic actuator. At step 620, a voltage is measured across the haptic actuator while driving the haptic actuator. The voltage across the haptic actuator comprises a back electromotive force BEMF component. For example, the BEMF component may be a back-EMF voltage $V_{BEMF}$. At step 630, the current signal is adjusted based on the back electromotive force component. The method may include extracting the back electromagnetic force, BEMF, component from the sensed voltage.

This approach can be used to achieve a precise haptic feedback without increasing the complexity of the system. This means that a haptic system can be implemented with a small footprint, making it suitable for use with mobile devices and wearable applications. Using the above method also reduces the power consumption of the system.

Figure 7:
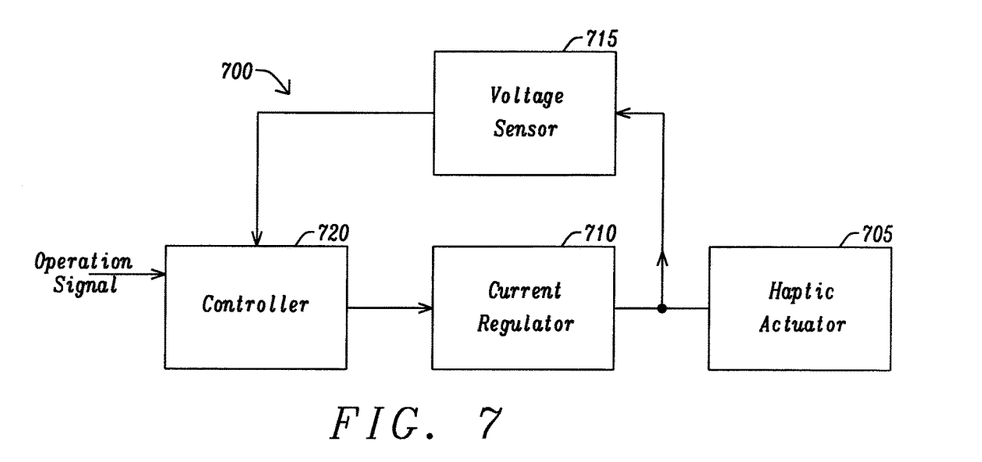
FIG. 7 is a diagram of a haptic system for implementing the method of FIG. 6.

FIG. 7 illustrates a haptic system 700 for implementing the method of FIG. 6. The system includes a haptic actuator 705, a current regulator 710, a voltage sensor 715 and a controller 720.

The haptic actuator 705 may be implemented in different ways. For example, the haptic actuator may be a device adapted to move a mass such as an eccentric rotating mass ERM or a linear resonant actuator LRA.

The current regulator 710 has an input for receiving a control signal from the controller 720 and an output for providing a current to the haptic actuator 705. The current regulator 710, is adapted to adjust the current signal using the control signal. The voltage sensor 715 is coupled between the haptic actuator 705 and the controller 720. The voltage sensor 715 is adapted to sense a voltage across the haptic actuator. The controller 720 is coupled to the current regulator 710. The controller 720 is adapted to receive the voltage across the haptic actuator, and to provide a control signal to the current regulator based at least in part on the voltage across the haptic actuator. The voltage can be a direct voltage or a representation of the voltage such as a filtered value of the voltage. The controller 720 has a first input for receiving a voltage value from the voltage sensor 715, a second input for receiving an operation signal and an output for providing the control signal. The operation signal may be a signal to start or stop the haptic actuator depending on a specific circumstance. When considering the example of a mobile phone, the operating signal may for instance be triggered by an incoming call or message. Alternatively, the operating signal may be triggered by the user touching the screen or keyboard of the mobile phone.

The current regulator 710 may be implemented in different fashions. For example, the current regulator may comprise a driver such as a differential H-bridge, coupled to a current control loop. The current control loop may use for example a PWM or a linear control technique.

In operation, the current regulator 710 provides a current signal to the haptic actuator 705. The voltage sensor 715 senses a voltage $V_{out}$ across the haptic actuator and sends a feedback signal to the controller 720. For instance, the feedback signal may be equal or proportional to $V_{out}$.

The controller 720 may operate in different fashions. In a first approach, the controller 720 extracts a BEMF component from the feedback signal. This can be achieved by subtracting the term IR from the measured voltage $V_{out}$ as expressed by equation (1) above. Such a subtraction can be performed digitally using known values of R and I. Alternatively, the subtraction can be performed by removing a voltage value measured at the end of a sampling period, for example a value measured at time t2 in FIG. 9.

The controller 720 then compares a parameter of the BEMF component with a reference value. For example, the controller may compare at least one of an amplitude, a phase or a frequency of the BEMF component with a reference value. For instance, the controller 720 may compare an amplitude of the BEMF component with a maximum value. Alternatively, or in combination the controller may identify the phase of the BEMF signal compared to the current drive signal.

In a second approach, the feedback signal, for example the output voltage $V_{out}$, is used without extracting the BEMF component $V_{BEMF}$. In this case, an amplitude of the output voltage $V_{out}$ may be measured at one or more points in time. The amplitude measured is a function of the BEMF component. For example, the amplitude of the output voltage $V_{out}$ may be measured at a point in time when a maximum amplitude of the BEMF component $V_{BEMF}$, is expected to occur. For instance, with respect to FIG. 9, in which the haptic actuator is operated at resonance frequency, such a point may be half way between the times t0 and t2, or half way between the times t2 and t4. The amplitude of the output voltage measured at this point may then be compared with a known value. For example, the known value may be a reference value of the amplitude of $V_{out}$, when the haptic actuator is operated in a certain regime. For instance, a known amplitude of $V_{out}$, at a certain point in time when the haptic actuator is operated at resonance frequency.

Using either the first or the second approach, the controller may be able to identify a regime of operation of the actuator. For example, the actuator may be operated at resonance frequency or off-resonance, the actuator may be slowing down or accelerating etc. . . . . The controller 720 then generates one or more control signal to adjust the current signal driving the haptic actuator.

The control signal may be generated based on a current level of operation of the actuator compared with a desired level of operation. For example, the controller may receive an operation signal to drive the haptic actuator at resonance frequency. The control signal generated is then sent to the current regulator 710. The current regulator then adjusts the current signal using on the control signal. For example, the current regulator may change at least one of the amplitude and frequency of the current signal.

Figure 8:
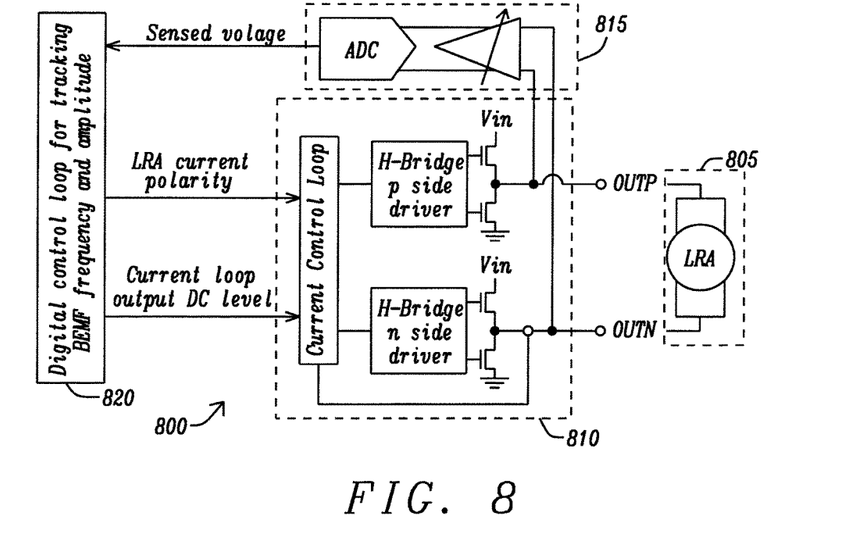
FIG. 8 is an exemplary embodiment of the haptic system of FIG. 7.

FIG. 8 illustrates an exemplary embodiment of a haptic system 800. In this instance the haptic actuator is an LRA 805 having a first terminal and a second terminal. The current regulator 810 includes a differential H-bridge coupled to a current control loop. The differential H-bridge has a first bridge formed by two power switches coupled to a first driver and a second bridge formed by another two power switches coupled to a second driver. The differential H-bridge has a first output coupled to the first terminal of the LRA and a second output coupled to the second terminal of the LRA. The current control loop circuit has a first input for receiving the control signal from the controller 820, a second input for receiving a current value from the differential H-bridge and two outputs for controlling the first and second drivers of the differential H-bridge.

The voltage sensor 815 includes a preamplifier coupled to an analogue to digital converter ADC. The pre-amplifier has a first input coupled to the output of the first terminal, a second input coupled to the second terminal of the LRA, and an output coupled to an input of the ADC.

The controller 820 may be a digital controller for tracking the BEMF frequency and amplitude. For example, the controller may comprise a proportional-integral-derivative PID controller. For instance, the PID controller may be used to adjust the drive frequency to match to the resonance frequency of the haptic actuator. The PID controller may also be used to adjust the drive frequency to be greater than the resonant frequency of the haptic actuator, to achieve overdrive. The controller 820 has a first input for receiving a voltage value from the voltage sensor 815, and at least one output for providing a control signal. In the present example, the controller has a first and a second output for providing a first and a second control signal respectively. The first control signal may be adapted to control the polarity of the drive current, and the second control signal may be adapted to control a DC value of the drive current.

Figure 9:
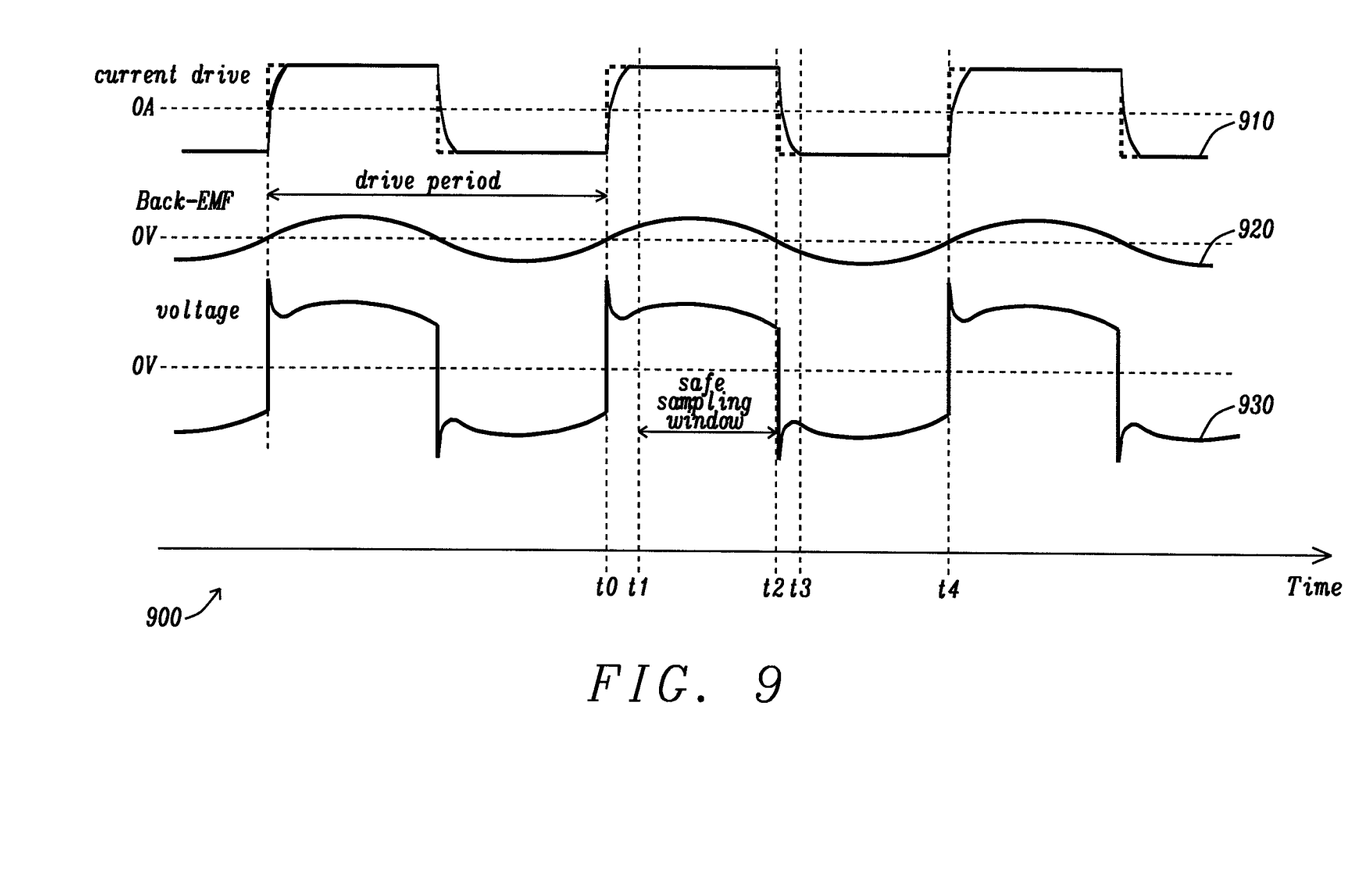
FIG. 9 is a time chart illustrating the working of the system of FIG. 8.

FIG. 9 is a time chart illustrating the working of the system of 8, showing the profiles of the current drive 910, the back-EMF voltage 920, and the output voltage $V_{out}$ 930.

In this example, the current drive signal 910 is a square wave signal. For example, the output current may change polarity between −50 mA and +50 mA. Alternatively, the current drive signal may have another AC waveform such as a sinusoidal waveform, a stepped sinusoidal waveform or a trapezoidal waveform. FIG. 9, represent operation of the LRA at or near resonance. In this regime of operation, the current signal 910 changes polarity, at a frequency that is equal or close to the resonant frequency of the haptic actuator. Thus, the back-EMF voltage 920 is in phase with the current drive signal 910.

The output voltage $V_{out}$ 930 across the LRA can be expressed by equation (1) as:

$$V_{out} = IR + \frac{Ldi}{dt} + V_{BEMF},$$

where I is the current drive, R is the resistance of the vibrator, L is the inductance of the LRA and $V_{BEMF}$ is the back-EMF voltage.

A drive period extends between the times t0 and t4. At time t0, the current drive 930 starts increasing.

Between the times t0 and t1, the current 910 increases from a negative current value to a positive current value. During this time the di/dt component of $V_{out}$ is positive. The output voltage 930 shows a sharp positive spike.

At time t1 the current drive 930 has reached its most positive value. Between times t1 and t2, the current drive 910 remains substantially constant. During this time the di/dt component of $V_{out}$ is zero or close to zero. The IR component of $V_{out}$ is a positive constant value. Therefore, the output voltage 930 corresponds to a positive DC component (IR) added to a positive $V_{BEMF}$ component.

At time t2 the current drive 910 starts decreasing. Between the times t2 and t3, the current decreases from a positive current value to a negative current value. During this time the di/dt component of $V_{out}$ is negative.

At time t3 the current drive 910 has reached its most negative value. Between times t3 and t4, the current drive 910 remains substantially constant. During this time the di/dt component of $V_{out}$ is zero or close to zero. The IR component of $V_{out}$ is a negative constant value. Therefore, the output voltage 930 corresponds to a negative DC component (IR) added to a negative $V_{BEMF}$ component.

The output voltage is typically not measured during the time windows t1-t0 and t3-t2, as any measurement performed during these time windows would be corrupted by the settling behaviour of the current regulator and the voltage sensor. Instead measurement of the output voltage is performed outside these time windows.

During the time windows t2-t1 and t4-t3, the voltage sensor 815 samples the output voltage $V_{out}=IR+V_{BEMF}$. The pre-amplifier part of the voltage sensor also filters out the PWM noise. The controller 820 receives the output voltage $V_{out}$ and extracts $V_{BEMF}$. The controller is then used to monitor variations in amplitude and frequency of $V_{BEMF}$. For example, the controller 820 may compare the phase of $V_{BEMF}$ with the phase of the current signal. When the haptic actuator is at resonance, the magnitude of $V_{BEMF}$ is maximum and $V_{BEMF}$ is in phase with the current drive signal. The controller 820 then generates one or more control signal to adjust the current signal.

The controller 820 can be implemented to perform different functionalities. For example, active overdrive can be accomplished by adjusting the level of DC current. Braking can be achieved by inverting the phase of the drive current signal. For example, a brake event may be implemented by delaying the current polarity change so that the polarity flips at full period instead of half period. The resulting waveform would thus be 180 degrees out of phase of the initial signal.

The current loop circuit then receives at least one control signal from the controller 820 and use the control signal to adjust the current drive signal. The control signal may be used to adjust at least one of an amplitude and a phase of the current signal. For example, the control current loop circuit may use the control signal to adjust a length of time between two consecutive polarity change events. The control signal may be used to adjust the drive period (hence the drive frequency) of the drive current to reach resonance of the haptic actuator. As a result, the current signal is adjusted to achieved a desired effect such as active acceleration or braking of the haptic actuator.

Figure 10:
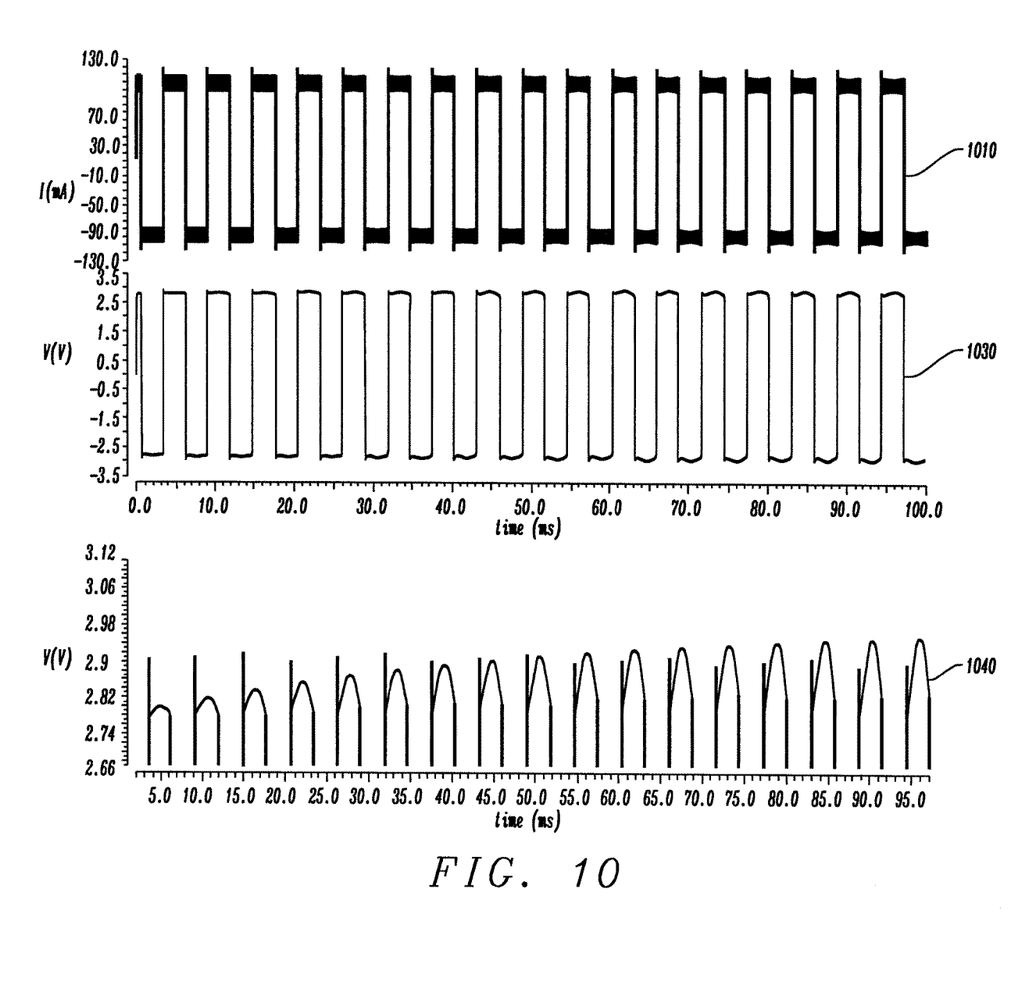
FIG. 10 is another time chart illustrating the working of the system of FIG. 8.

FIG. 10 shows the current signal 1010 and the output voltage 1030 obtained by simulating a system according to FIG. 8. A close up rendering 1040 of the positive portion of the output voltage 1030 shows that the BEMF component of the signal increases as the LRA accelerates. A sharp peak corresponding to the di/dt component of $V_{out}$ is also visible during change of polarity. As mentioned above, the current drive signal is not limited to a square wave waveform signal.

Figure 11A:
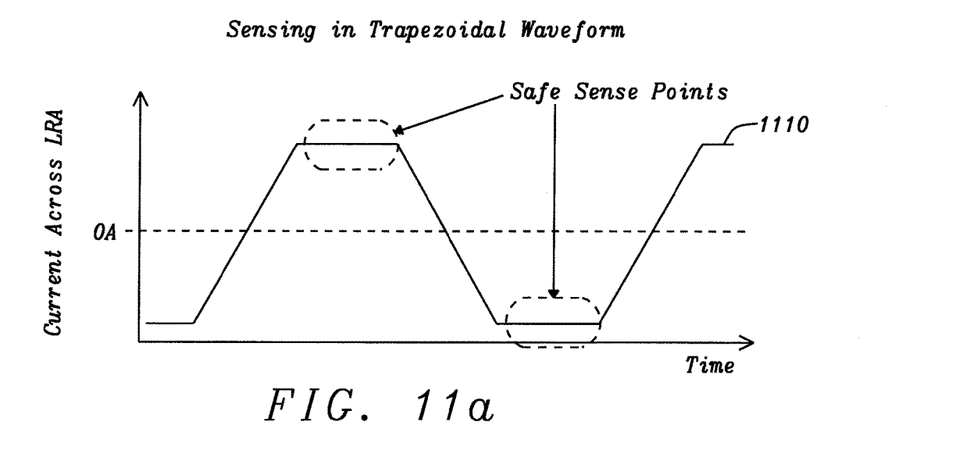
FIG. 11(a) is a current signal for driving a haptic actuator having a trapezoidal waveform.
Figure 11B:
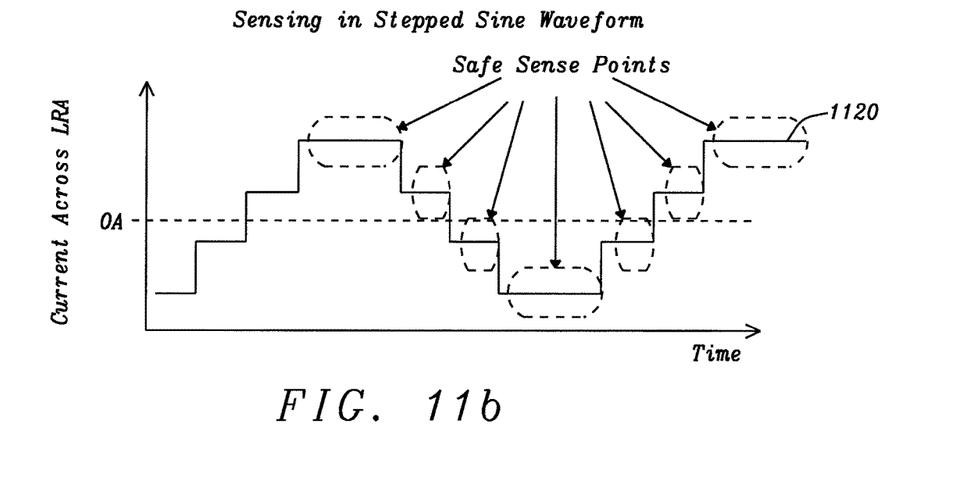
FIG. 11(b) is a current signal for driving a haptic actuator having a stepped sinusoidal waveform.

FIGS. 11(*a*) and 11(*b*) show an example of a current drive signal having a trapezoidal shape 1110 and a stepped sinusoidal shape 1120 respectively. The waveforms 1110 and 1120 have a plurality of flat portions corresponding to time-windows during which the current signal remains substantially constant and the output voltage can be measured. The duration of these time-windows may vary depending on the characteristic of the waveform. By driving the haptic actuator with a waveform having a trapezoidal shape, it is possible to reduce power dissipation of the system. Power dissipation can be reduced further by driving the haptic actuator with a current signal having a stepped sinusoidal shape. However, in this case the design of the system would become more complex. For example, the voltage filter and the current loop would require a faster settling time. This could be achieved by implementing a device with high order filtering or wide bandwidth.

It would also be possible to drive the haptic actuator using a sinusoidal waveform. In this instance, the output voltage across the haptic actuator would be measured at a point in time corresponding to the maximum amplitude or to the minimum amplitude of the sinusoidal waveform.

The haptic system of FIG. 8 can also be used to drive an ERM. In this case the current regulator may be operated to provide a DC current instead of an AC current. If the current regulator is implemented with a differential H-bridge, the system can still be used for active acceleration and braking of the ERM by changing the polarity of the drive current.

Figure 12:
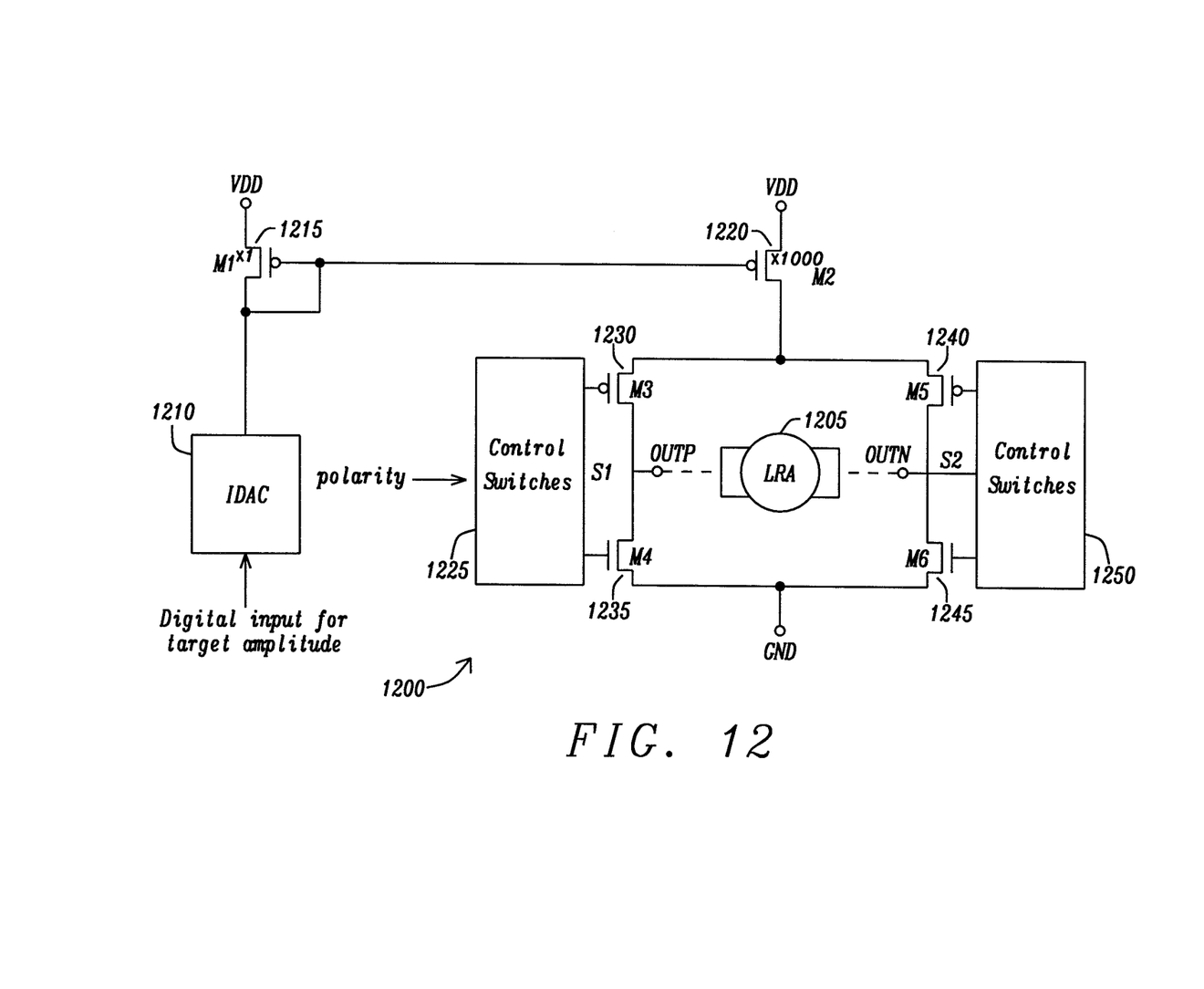
FIG. 12 is a diagram of a current regulator.

FIG. 12 illustrates an exemplary current regulator circuit coupled to an LRA 1205. The current regulator circuit includes a current control loop connected to a differential H-bridge. The current control loop is formed by an integrated digital to analog converter IDAC 1210 coupled to a current mirror formed by transistors M1 1215 and M2 1220. The transistor M2 is a larger in size than M1. For example, M2 may be thousand times larger than M1. The differential H-bridge driver includes a first driver 1225 coupled to transistors M3 1230 and M4 1235; and a second driver 1250 coupled to transistors M5 1240 and M6 1245. Transistors M3, M4, M5, and M6 are arranged to form an H-bride. Transistors M1, M2, M3 and M5 may be P-channel MOSFETs, while transistors M4 and M6 may be N-channel MOSFETs. A drain of M3 is coupled to a drain of M4 at a switching node S1, and a drain of M5 is coupled to a drain of M6 at a switching node S2. The LRA 1205 is connected to switching nodes S1 and S2. A drain of transistor M2 is coupled to a source of transistors M3 and M5.

In operation, the IDAC receives a first digital signal from the controller (not shown) to control an amplitude of the current signal. The digital signal is converted into a current I1 by the IDAC. Changing the current I1, also changes the current I2 across transistor M2. Therefore, by varying I1, the circuit can adjust the amplitude of the driving current provided by the differential H-bridge to the LRA. The driver 1225 receives a second digital signal from the controller to control the polarity of the current signal.

Figure 13:
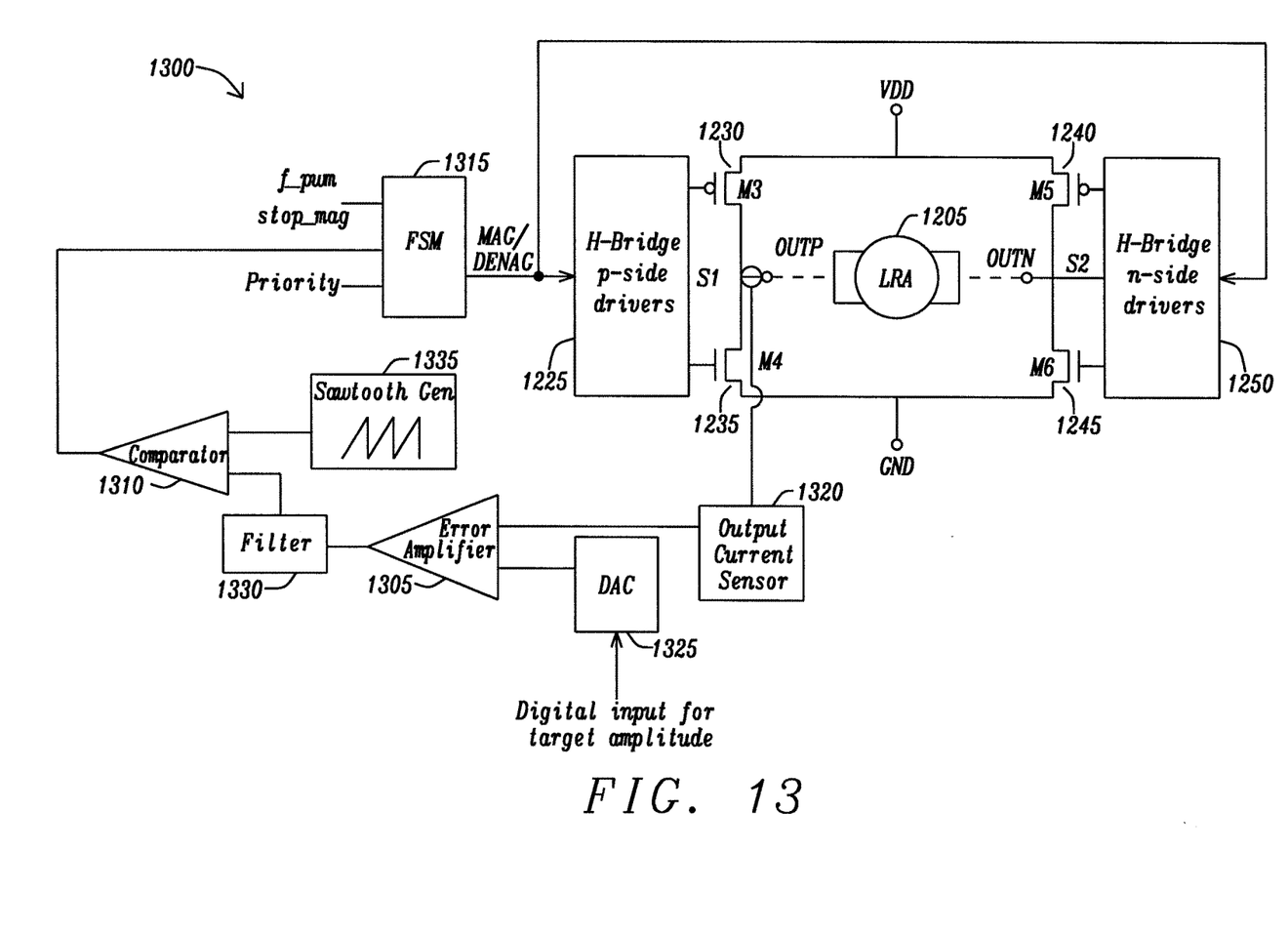
FIG. 13 is a diagram of another current regulator.

FIG. 13 shows another example of current regulator circuit coupled to an LRA. The differential H-bridge is identical to the differential H-bridge described with reference to FIG. 12, the same reference numerals being used to describe the same components. The current control loop includes an error amplifier 1305, a comparator 1310, and a finite-state machine, FSM 1315.

A current sensor 1320 is coupled to an output of the differential H-bridge. For example, the current sensor 1320 is coupled to the switch node S1 to sense the drive current.

The error amplifier 1305 has a first input for receiving a current value sensed by the current sensor 1320, a second input for receiving a signal from a DAC 1325 connected to the controller (not shown), and one output coupled to a filter 1330. The DAC is adapted to receive a first control signal from the controller.

The comparator 1310 has a first input for receiving an output of the filter 1330, a second input coupled to a ramp generator 1335, and an output coupled to the FSM 1315.

The FSM 1315 has a first input for receiving an output of the comparator 1310, a second input for receiving a second control signal from the controller to control the polarity of the current signal, and a third input for receiving a pulse width modulation PWM signal from a PWM generator (not shown). The FSM has one output coupled to the differential H-bridge. For example, the FSM is connected to the driver 1225 and to the driver 1250.

In operation, the DAC 1325 receives the first control signal from the controller to control an amplitude of the current signal. The control signal is a digital signal converted into an analog signal by the DAC. The error amplifier generates an error signal based on the analog control signal received from the DAC and the current value received from the current sensor 1320. The error signal is filtered by filter 1330. The comparator 1310 compares the error signal with a ramp signal generated by the ramp generator 1335, and provides a logic signal to the FSM.

The FSM receives the logic signal from the comparator 1310, the second control signal from the controller and the PWM signal, and provides a logic signal to control the transistors M3, M4, M5, and M6 of the differential H-bridge.

The current regulator of FIG. 13 is more energy efficient than the current regulator of FIG. 12.

Figure 14:
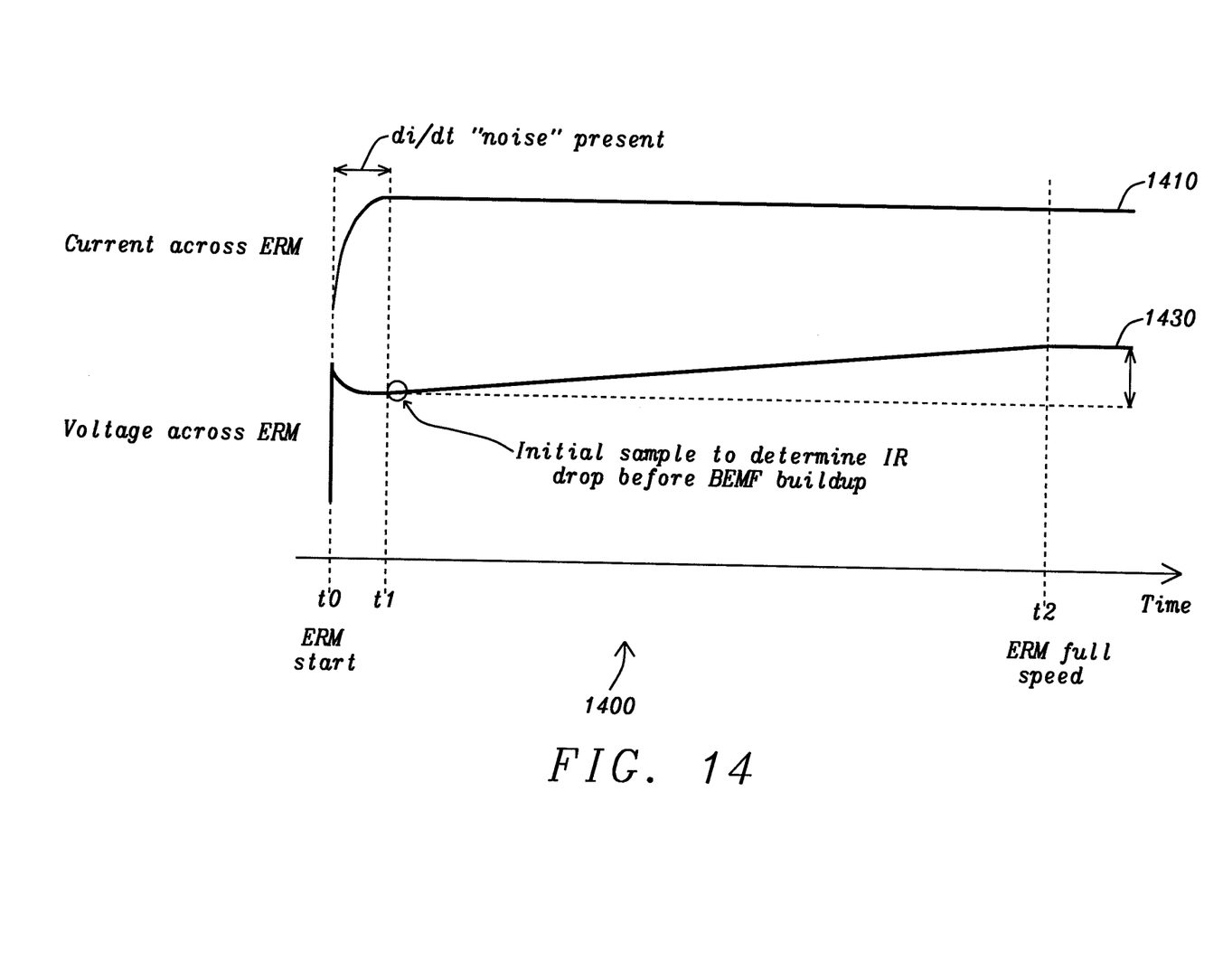
FIG. 14 is a time chart illustrating the working of an ERM haptic system.

FIG. 14 shows the profiles of the current drive 1410, and the output voltage $V_{out}$ 1430 provided by a current regulator and applied across an ERM.

At time t0 the current 1410 across the ERM starts increasing and the voltage 1430 across the ERM increases sharply.

Between times t0 and t1, the current 1410 keeps increasing up to a maximum value. For example, the time t1-t0 may be 100-200 μs. During this period, the voltage 1430 decreases.

At time t1 the current 1410 has reaches a maximum value and the voltage 1430 reaches a local minimum. At this point $V_{BEMF}$ is null or has a negligible value.

Between times t1 and t2 the $V_{BEMF}$ increases to reach a maximum value at time t2 when the ERM is operated at full speed.

ERMs have a relatively long start-up time, in the order of hundreds of ms, hence $V_{BEMF}$ takes a certain amount of time to build up across the motor. Consequently, at start up, once the current loop has settled (100-200 μs), the voltage across the ERM will be equal to the IR drop plus a negligible amount of BEMF.

By taking a sample measurement at, or around time t1, it is possible to obtain a reference corresponding to the value of $V_{Out}$ when $V_{BEMF}$ is approximately zero. The value of $V_{BEMF}(t)$ may be obtained by measuring $V_{Out}$ at a later time according to equation (3)

$$V_{BEMF}(t) = V_{Out}(t) - V_{Out}(t1) \qquad (3)$$

A skilled person will appreciate that variations of the disclosed arrangements are possible without departing from the disclosure. Although the haptic system of the disclosure has been described with respect to LRA and ERM actuators, other types of haptic actuators could be used. For example, the system could be used with electro-active polymers actuators or piezoelectric actuators. Accordingly, the above description of the specific embodiment is made by way of example only and not for the purposes of limitation. It will be clear to the skilled person that minor modifications may be made without significant changes to the operation described.

What is claimed is:

1. A haptic system comprising
a haptic actuator;
a voltage sensor coupled to the haptic actuator, to sense a voltage across the haptic actuator, wherein the voltage across the haptic actuator comprises a back electromotive force component; and
a current regulator coupled to the haptic actuator and to the voltage sensor; the current regulator being adapted to provide a current signal to drive the haptic actuator and to adjust the current signal based on the back electromotive force component;
wherein the current regulator comprises a current driver coupled to a current control loop.

2. The haptic system as claimed in claim 1, comprising a controller coupled to the current regulator and to the voltage sensor; the controller being adapted to receive the voltage across the haptic actuator, and to provide a control signal to the current regulator.

3. The haptic system as claimed in claim 2, wherein the control signal is adapted to adjust at least one of an amplitude and a phase of the current signal.

4. The haptic system as claimed in claim 2, wherein the controller is adapted to extract the back electromotive force component from the voltage and to generate the control signal based at least in part on the back electromotive force component.

5. The haptic system as claimed in claim 2, wherein the controller is adapted to monitor a parameter of the back electromotive force component; and to generate the control signal based on the parameter.

6. The haptic system as claimed in claim 5, wherein the controller is adapted to compare the parameter with a reference value.

7. The haptic system as claimed in claim 5, wherein the parameter comprises at least one of an amplitude, a phase, and a frequency of the back electromotive force component.

8. The system as claimed in claim 1, wherein the current signal comprises a portion which remains constant during a time-window; and wherein the voltage sensor is adapted to sense the voltage across the haptic actuator at a point in time within the time-window.

9. The haptic system as claimed in claim 1, wherein the current control loop comprises a current sensor to sense the current signal, and a comparator to compare the current signal with the control signal and to generate an error signal.

10. An apparatus for controlling a haptic actuator, the apparatus comprising
a voltage sensor to sense a voltage across the haptic actuator; wherein the voltage across the haptic actuator comprises a back electromotive force component; and
a current regulator, the current regulator being adapted to provide a current signal to drive the haptic actuator and to adjust the current signal based on the back electromotive force component;
wherein the current regulator comprises a current driver coupled to a current control loop.

11. A mobile device comprising a haptic system; the haptic system comprising
a haptic actuator;
a voltage sensor coupled to the haptic actuator, to sense a voltage across the haptic actuator; wherein the voltage across the haptic actuator comprises a back electromotive force component; and
a current regulator coupled to the haptic actuator and to the voltage sensor; the current regulator being adapted to provide a current signal to drive the haptic actuator and to adjust the current signal based on the back electromotive force component;
wherein the current regulator comprises a current driver coupled to a current control loop.

12. A method of operating a haptic actuator comprising
providing a current regulator comprising a current driver coupled to a current control loop; the current regulator being adapted to
provide a current signal to drive the haptic actuator;
sensing a voltage across the haptic actuator while driving the haptic actuator; wherein the voltage across the haptic actuator comprises a back electromotive force component; and adjusting the current signal based on the back electromotive force component.

13. The method as claimed in claim 12, comprising extracting the back electromotive force component from the sensed voltage.

14. The method as claimed in claim 12, comprising identifying a time-window during which the current signal remains constant; and sensing the voltage across the haptic actuator at a point in time within the time-window.

15. The method as claimed in claim 12, wherein adjusting the current signal comprises generating a control signal based on the back electromotive force component.

16. The method as claimed in claim 15, comprising monitoring a parameter of the back electromotive force component; and generating the control signal based on the parameter.

17. The method as claimed in claim 16, wherein generating the control signal comprises comparing the parameter with a reference value.

18. The method as claimed in claim 16, wherein the parameter comprises at least one of an amplitude, a phase, and a frequency of the back electromotive force component.

19. The method as claimed in claim 12, comprising sensing the current signal, comparing the current signal with the control signal and generating an error signal.

* * * * *